(12) United States Patent
Yates et al.

(10) Patent No.: US 7,575,693 B2
(45) Date of Patent: *Aug. 18, 2009

(54) METHOD OF ALIGNING NANOTUBES AND WIRES WITH AN ETCHED FEATURE

(75) Inventors: Colin D. Yates, Clackamas, OR (US); Thomas Rueckes, Rockport, MA (US); Steven L. Konsek, Malmö (SE); Mitchell Meinhold, Arlington, MA (US); Claude L. Bertin, Venice, FL (US)

(73) Assignee: Nantero, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/304,801

(22) Filed: Dec. 14, 2005

(65) Prior Publication Data

US 2006/0264053 A1 Nov. 23, 2006

Related U.S. Application Data

(60) Provisional application No. 60/684,026, filed on May 23, 2005.

(51) Int. Cl.
*H01L 21/302* (2006.01)
(52) U.S. Cl. .............. 216/75; 216/77; 216/89; 216/102; 977/742
(58) Field of Classification Search ............ 216/75, 216/77, 89, 102; 977/742
See application file for complete search history.

(56) References Cited

U.S. PATENT DOCUMENTS

| 6,645,861 | B2 | 11/2003 | Cabral, Jr. et al. |
|---|---|---|---|
| 2005/0047244 | A1 | 3/2005 | Rueckes et al. |
| 2005/0052894 | A1 | 3/2005 | Segal et al. |
| 2005/0053525 | A1 | 3/2005 | Segal et al. |
| 2005/0056825 | A1 | 3/2005 | Bertin et al. |
| 2005/0056866 | A1 | 3/2005 | Bertin et al. |
| 2005/0056877 | A1 | 3/2005 | Rueckes et al. |
| 2005/0058590 | A1 | 3/2005 | Sen et al. |
| 2005/0058797 | A1 | 3/2005 | Sen et al. |
| 2005/0058834 | A1 | 3/2005 | Rueckes et al. |
| 2005/0059176 | A1 | 3/2005 | Rueckes et al. |
| 2005/0059210 | A1 | 3/2005 | Rueckes et al. |
| 2005/0062035 | A1 | 3/2005 | Bertin et al. |
| 2005/0062062 | A1 | 3/2005 | Bertin et al. |
| 2005/0062070 | A1 | 3/2005 | Bertin et al. |

(Continued)

OTHER PUBLICATIONS

Office Action Mailed Nov. 6, 2007 from U.S. Appl. No. 11/307,871.

(Continued)

*Primary Examiner*—Binh X Tran
(74) *Attorney, Agent, or Firm*—Wilmer Cutler Pickering Hale and Dorr LLP

(57) ABSTRACT

A method of forming an aligned connection between a nanotube layer and an etched feature is disclosed. An etched feature is formed having a top and a side and optionally a notched feature at the top. A patterned nanotube layer is formed such that the nanotube layer contacts portions of the side and overlaps a portion of the top of the etched feature. The nanotube layer is then covered with an insulating layer. Then a top portion of the insulating layer is removed to expose a top portion of the etched feature.

16 Claims, 4 Drawing Sheets

U.S. PATENT DOCUMENTS

| | | |
|---|---|---|
| 2005/0063244 A1 | 3/2005 | Bertin et al. |
| 2005/0065741 A1 | 3/2005 | Segal et al. |
| 2005/0074926 A1 | 4/2005 | Bertin et al. |
| 2005/0083210 A1 | 4/2005 | Segal et al. |
| 2005/0101112 A1 | 5/2005 | Rueckes et al. |
| 2005/0122775 A1 | 6/2005 | Koyanagi et al. |
| 2005/0128788 A1 | 6/2005 | Segal et al. |
| 2005/0174842 A1 | 8/2005 | Bertin et al. |
| 2005/0191495 A1 | 9/2005 | Rueckes et al. |
| 2005/0237781 A1 | 10/2005 | Bertin et al. |
| 2005/0269553 A1 | 12/2005 | Sen et al. |
| 2005/0269554 A1 | 12/2005 | Sen et al. |
| 2005/0282516 A1 | 12/2005 | Bertin |
| 2006/0011972 A1* | 1/2006 | Graham et al. ............... 257/324 |
| 2006/0044035 A1 | 3/2006 | Bertin |
| 2006/0061389 A1 | 3/2006 | Bertin |
| 2006/0063368 A1* | 3/2006 | Sharma ...................... 438/618 |
| 2006/0125033 A1 | 6/2006 | Segal et al. |
| 2006/0128049 A1 | 6/2006 | Jaiprakash et al. |
| 2006/0183278 A1 | 8/2006 | Bertin et al. |
| 2006/0193093 A1 | 8/2006 | Bertin et al. |
| 2006/0204427 A1 | 9/2006 | Ghenciu et al. |
| 2006/0231865 A1 | 10/2006 | Rueckes et al. |
| 2006/0237805 A1 | 10/2006 | Segal et al. |
| 2006/0250843 A1 | 11/2006 | Bertin et al. |
| 2006/0250856 A1 | 11/2006 | Bertin et al. |
| 2006/0255414 A1* | 11/2006 | Appenzeller et al. ......... 257/401 |
| 2006/0255834 A1 | 11/2006 | Bertin |
| 2006/0276056 A1 | 12/2006 | Ward et al. |
| 2006/0281287 A1* | 12/2006 | Yates et al. ................. 438/585 |
| 2007/0018260 A1 | 1/2007 | Jaiprakash et al. |
| 2007/0020859 A1 | 1/2007 | Bertin et al. |
| 2007/0029612 A1 | 2/2007 | Sandhu |
| 2007/0030721 A1 | 2/2007 | Segal et al. |
| 2007/0063740 A1 | 3/2007 | Bertin et al. |
| 2007/0108482 A1 | 5/2007 | Bertin et al. |

OTHER PUBLICATIONS

Office Action Mailed Dec. 18, 2007 from U.S. Appl. No. 11/304,871.
Notice of Allowance in U.S. Appl. No. 11/304,871, mailed Apr. 18, 2008.
Allowed Claims from U.S. Appl. No. 11/304,871.

\* cited by examiner

METHOD OF ALIGNING NANOTUBES AND WIRES WITH AN ETCHED FEATURE

RELATED APPLICATION

This application claims priority to U.S. Provisional Patent Application Ser. No. 60/684,026, entitled "Method for Aligning Carbon Nanotubes with an Etched Feature", by inventor Cohn D. Yates, filed on May 23, 2005, which is hereby incorporated by reference and from which priority is hereby claimed. This Application is related to a co-pending Patent Application entitled "Method of Aligning Deposited Nanotubes onto an Etched Feature Using a Spacer", filed on Dec. 14, 2005, having U.S. Ser. No. 11/304,871, which is incorporated herein by reference and from which priority is hereby claimed.

TECHNICAL FIELD

The invention described herein relates generally to carbon nanotube layer fabrication and alignment processes. In particular, the invention relates to methods, processes, and structures enabling a carbon nanotube layer to be aligned with specific features formed on a semiconductor substrate.

Particular low-K materials include, but are not limited to: organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; and, mixtures, or blends, of organic polymers and spin-on glasses. Further, examples of CVD low-K materials include SiCOH or polymers of parylene and napthalene, copolymers of parylene with polysiloxanes or teflon, and polymers of polysiloxane. Other ILD 203 materials include, but are not limited to, silicon dioxide or combinations of silicon dioxide and other doped dielectrics (e.g., BPSG, PSG)

BACKGROUND

Nano-materials and nanotechnologies are fast becoming a force in semiconductor technology. Nano-materials are generally described as materials whose fabrication scale is so small that the molecular properties of the materials begin to predominate over the bulk properties of the material.

In particular, carbon nanotube technologies are becoming a significant factor in electronic device construction. In one implementation, nano-materials comprise nanotubes. Single-wall carbon nanotubes (SWCNT) are quasi-one dimensional nanowires, which exhibit either metallic or semiconductor properties depending upon their chirality and radius. In some implementations, such carbon nanotubes are in the range of about 3-50 nanometers (nm) in diameter and several micrometers (μm) long. Single-wall nanotubes have been demonstrated as both semiconductor layers in thin film transistors as well as metallic interconnects between metal layers. Applications of carbon nanotube (CNT) electronic devices are compounding almost daily. Most notably are new CMOS transistors, non-volatile memory and backend interconnects.

Nanotubes can be deposited in layers or ribbons of materials to, for example, construct electrical connections or nanowires. One new area of implementation is that of non-volatile memory devices. One such application is described in U.S. Pat. No. 6,919,592 which is directed to hybrid circuits using nanotube electromechanical memory. This reference is hereby incorporated by reference for all purposes. This reference also describes in detail the methods of forming nanotube layers as known to those having ordinary skill in the art. A fuller description of the operation of these devices can be obtained in these and other related references.

The inventors point out that this is just but one of a myriad of potential applications for this extremely versatile technology. In many applications, the nanotubes form conductive layers that are is deposited onto substrates. During such fabrication of electrical structures, alignment issues for the deposition of nanotube layers become important.

FIGS. 1(a) and 1(b) depict a perfectly aligned carbon nanotube (CNT) layer 101 aligned against the side 102 of a metallization line 103. The problem with forming this structure using existing technologies is that it is dependent on extreme adherence to very narrow tolerances. Using alignment marks the CNT patterns are aligned to the metallization pattern to effect the alignment of the two structures.

In practice such alignment fails a significant portion of the time due to alignment errors. What is needed is a robust manufacturable process for aligning nanotubes with an associated metallization layer.

SUMMARY OF THE INVENTION

In accordance with the principles of the present invention, an improved fabrication process for aligning layers of nanomaterial with an etched feature is disclosed.

In general, this disclosure teaches methods to form nanomaterial layers that are aligned with adjacent etched features.

One embodiment of the invention comprises a method of forming a carbon nanotube electrical connection aligned with an etched feature. The method involving forming an etched feature having a top and a side and depositing a patterned nanotube layer on the substrate such that the nanotube layer contacts portions of the side and overlaps a portion of the top of the etched feature. The nanotube layer is then covered with an insulating layer. Then a top portion of the insulating layer is removed to expose a top portion of the etched feature and a portion of the nanotube layer is removed from on top of the etched feature leaving a portion of the nanotube layer exposed.

In another embodiment, a method involves forming an etched feature with a notched portion at its top. A patterned nanotube layer is deposited on the substrate such that the nanotube layer overlaps the notched portion of the top of the etched feature. The nanotube layer is then covered with an insulating layer. Then a top portion of the insulating layer is removed to expose a top portion of the etched feature. Optionally, a portion of the nanotube layer is removed from on top of the etched feature leaving a portion of the nanotube layer exposed.

In another embodiment, a carbon nanotube electrical connection to a metal layer is disclosed. The connection including a raised metal layer formed on a substrate, the metal layer having a notched feature formed thereon. A nanotube layer is formed in contact with the metal layer so that the nanotube layer overlaps the notched portion of the top of the metal layer. An insulating layer is on the substrate, the insulating layer covers the nanotube layer and leaves a portion of the top of the metal layer exposed.

These and other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which.

It is to be understood that in the drawings like reference numerals designate like structural elements. Also, it is understood that the depictions in the Figures are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In general, the present invention encompasses semiconductor manufacturing techniques that are used to align nano-material layers and ribbons with etched features. In one notable embodiment, the etched features comprise metallization lines. Additionally, such nano-materials are specifically contemplated to include carbon nanotubes (CNT). In one approach, the etched feature is formed having a notch in its top surface. Nanomaterials are then deposited onto the surface covering the notched feature. The nano-materials also can extend beyond the final desired endpoint for the pattern of nanomaterials. The nanomaterials are then covered with insulating materials. Then the top of the insulating material is removed. The removal of the insulating material generally exposes a top portion of the etched feature. However, such construction resolves alignment issues.

Figure 1A:
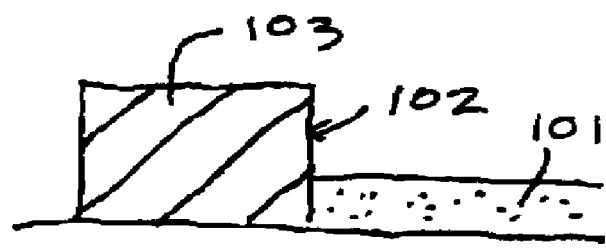
FIGS. 1(a) & 1(b) are simplified schematic depictions of a substrate having a nanotube layer aligned with a metal-containing layer.
Figure 1B:
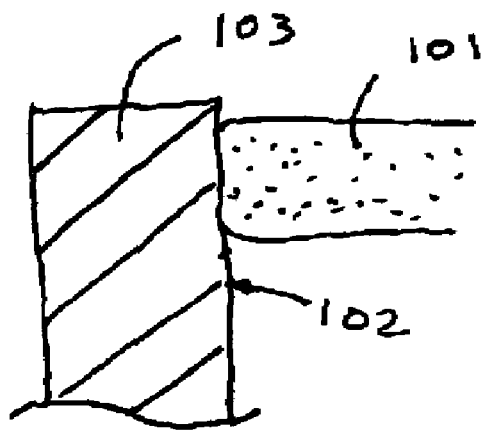
Figure 2:
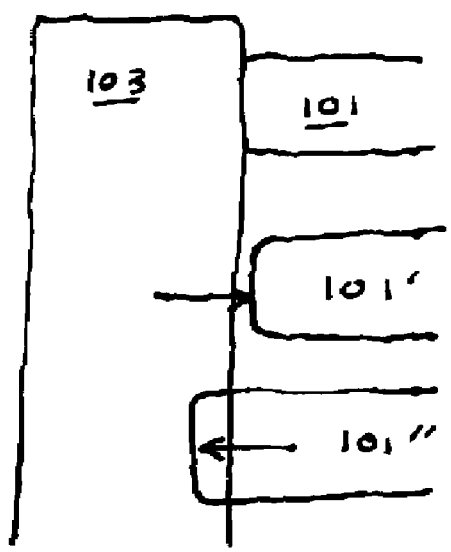
FIG. 2 is simplified plan view of a substrate illustrating some of the misalignment issues addressed by embodiments of the invention.

FIG. 2 illustrates some alignment problems facing a manufacturer today. A CNT ribbon 101 that is perfectly aligned and has good contact with metallization line 103 is shown at the interface between 101 and 103. Misaligned CNT ribbon 101' is has drifted to the right (as indicated by the arrow) opening a space between the CNT ribbon 101' and the metallization line 103. This will lead to circuit failure. Misaligned CNT ribbon 101" is has drifted to far to the left (as indicated by the arrow) causing an excessive amount overlap onto the metallization line 103. This can lead further process and alignment difficulties.

The inventors have discovered alternative fabrication processes which circumvent many of the difficulties in present processes.

Figure 3A:
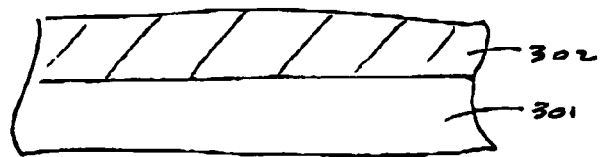
FIGS. 3(a)-3(e) depict a series of a simplified schematic section views of a process embodiment used to fabricate nanotube layers aligned with an etched feature in accordance with the teachings of the invention.

FIG. 3(a) is a simplified schematic section view of a substrate 301 having a metallization layer 302 formed thereon. The substrate can be of any configuration or material. Common substrate surfaces include but are not limited to silicon, gallium arsenide, silicon dioxide, dielectric materials and so on. Additionally, the substrate can include vias, trenches, and a myriad of other substrate conformations and configurations as well as a range of circuit elements and operational electronic structures. The metallization layer can be constructed of any of a number of metal containing materials. Such materials can include but are not limited to aluminum, tungsten, tantalum, titanium, gold, silver, platinum, alloyed materials, metal nitrides, or multi-layered structures containing many layers that can comprise more than one material. In one implementation, an aluminum metal layer 302 of about 1000 Å (angstrom) thick can be formed. Additionally, the applicants point out that a wide range of alternative aluminum thicknesses can be employed. For example, ranging from about 400 Å to about 2 µm (micrometer).

Figure 3B:
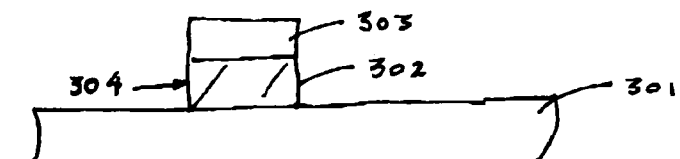

Referring to FIG. 3(b) the metallization layer 302 is masked 303 (e.g., using a photoresist arranged in a mask pattern). The metal 302 is then anisotropically etched to form vertical sidewalls 304. Methods of anisotropic etching to obtain nearly vertical sidewalls are known to those having ordinary skill in the art. By way of example, reactive ion etching (RIE) or other directional etch techniques can be employed. The exact techniques will vary depending on the metal materials and substrate materials involved as well the final desired profile of the sidewalls.

Subsequently, a layer of nanomaterials is deposited on the substrate and then patterned and etched into the desired pattern. Significantly, the nanomaterials overlap onto the top of the metal layer an amount greater than the final desired amount of overlap. Commonly, the nano-material is comprised of carbon nanotubes. However, many other nano-materials known in the art can also be employed in accordance with the principles of the invention. Methods of forming such layers of carbon nanotubes are well known in the art and need not be discussed in detail here.

Figure 3C:
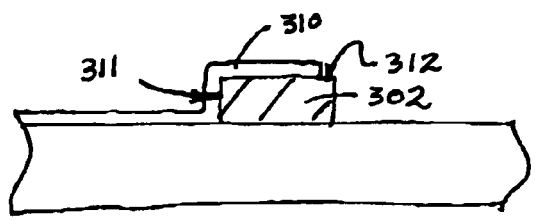

Referring to FIG. 3(c), the substrate 301 is shown with the etched metal layer 302 in place. A layer 310 of carbon nanotubes has been deposited onto the substrate and then patterned and etched to form a ribbon 310 of CNT material in place on the surface including the sidewall 311 of the metal layer 302 and the top 312 of the metal layer 302. The CNT ribbon 310 extends beyond the desired amount of overlap. In this example, the desired amount of overlap is no overlap (i.e., the ribbon is to extend to the sidewall and no further). Once the layer 310 of carbon nano-tubes has been etched into the appropriate pattern the photo mask is removed. Because the layer of carbon nano-tubes is delicate, solvents are used to remove the photomask layer.

Figure 3D:
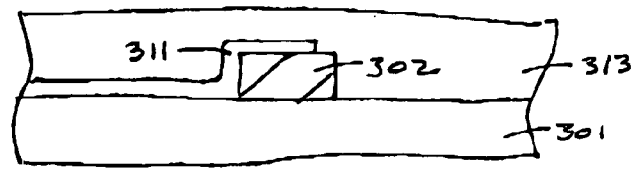

Referring to FIG. 3(d), the substrate 301 is then covered in an electrically insulative material. This insulating material 313 covered the CNT 310 and the metal layer 302 as well as portions of the substrate 301. One particularly useful embodiment uses silicon dioxide ($SiO_2$) as the insulating material 313. Of course, the inventors contemplate that any type of electrically insulating material can be employed to as the insulating material 313. Other commonly used insulative materials include but are not limited to low-K materials including (without limitation): organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; and, mixtures, or blends, of organic polymers and spin-on glasses. Further, CVD low-K materials could be used, such as SiCOH or polymers of parylene and napthalene, copolymers of parylene with polysiloxanes or teflon, and polymers of polysiloxane. Other insulative materials can include, but are not limited to, porous $SiO_2$ or combinations of silicon dioxide and other doped dielectrics (e.g., BPSG, PSG) and a range of other insulative and low-K dielectric materials known to those having ordinary skill in the art.

Figure 3E:
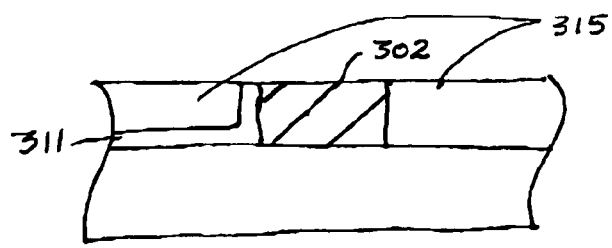

Once the CNT ribbon is insulated, the excess insulative material is removed to form an insulative layer and expose a portion of the metal layer if desired. Referring to FIG. 3(e), the excess insulating material is removed to form insulating layer 315. The CNT 310 remains in good electrical contact with the sidewalls 311 of the metal layer 302. Additionally, the insulating layer 315 provides good insulation for the buried CNT layer 310. The excess insulating material can be removed using techniques such as etching which is conducted until the metal layer is exposed. Alternatively CMP (chemical mechanical polishing techniques can be employed).

Figure 4A:
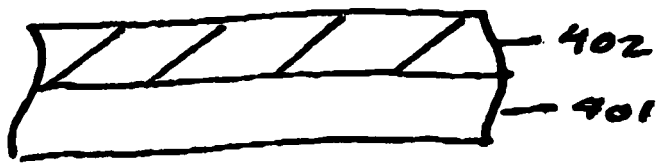
FIGS. 4(a)-4(g) depict another series of a simplified schematic section views of another process embodiment used to fabricate nanotube layers aligned with an etched feature in accordance with the teachings of the invention.

FIGS. 4(a)-4(g) depict yet another embodiment of constructing a nanotube apparatus. FIG. 4(a) is a simplified schematic section view of a substrate 401 having a metallization layer 402 formed thereon. The depicted substrate and metal is much the same as shown in FIG. 3(a).

Figure 4B:
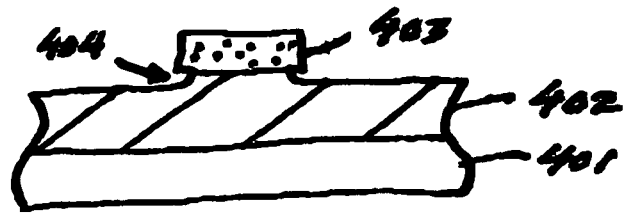

Referring to FIG. 4(b) the metallization layer 402 is masked 403 (e.g., using a photoresist arranged in a mask pattern). The metal 402 is then subjected to an isotropic etch techniques. Such isotropic etch techniques are well known to those having ordinary skill in the art. For example, if the metal layer comprises aluminum, one approach to isotropic etching can employ a standard phosphoric acid etch combination such as 16:1:1:2 (ratio of phosphoric acid: water: acetic acid: nitric acid). Such an etch process results in a suitable isotropic etch profile. This first isotropic etch operation etches the metal layer 402 such that some of the etch undercuts the mask pattern 403 and extends under edges of the mask pattern to remove a portion of the top surface of the metal layer forming a notched feature 404 (or other metal layer having a sloped profile or sloped side wall) on the metal layer. The precise amount of overetch or the size of the notched feature is selected by the user. Generally, it is preferable that the notch height be greater than about half the height (thickness) of the metal layer. This attribute is better illustrated in FIG. 4(c).

Figure 4C:
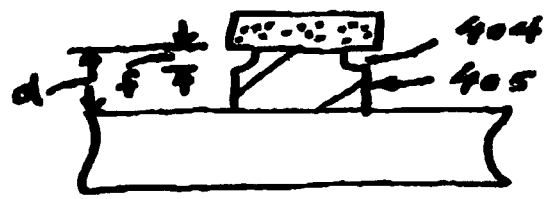

FIG. 4(c) shows a second etch step that comprises an anisotropic etch step. The remaining metal is anisotropically etched to form vertical sidewalls 405 below the etched feature 404. Methods of anisotropic etching to obtain nearly vertical sidewalls are known to those having ordinary skill in the art. By way of example, reactive ion etching (RIE) or other directional etch techniques can be employed. The exact techniques will vary depending on the metal materials and substrate materials involved as well the final desired profile of the sidewalls. As explained previously, the height f of the notched feature 404 is preferably less than about half the height d of the metal layer 402. At this point, the photomask layer 403 is removed.

Subsequently, a layer of nanomaterials is deposited on the substrate and then patterned and etched into the desired pattern. Significantly, the nanomaterials overlap into the notched region and onto the top of the metal layer an amount greater than the final desired amount of overlap. Commonly, the nano-material is comprised of carbon nanotubes. However, many other nano-materials known in the art can also be employed in accordance with the principles of the invention. Methods of forming such layers of carbon nanotubes are well known in the art and need not be discussed in detail here.

Figure 4D:
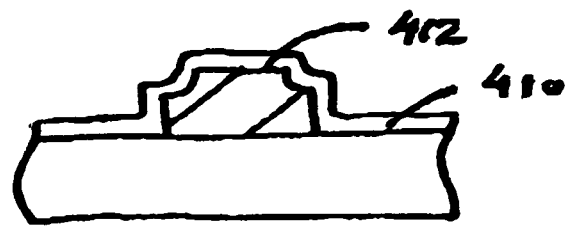

Referring to FIG. 4(d), the substrate 401 is shown with the etched metal layer 402 in place. A layer 410 of carbon nano-tubes has been deposited onto the substrate and then patterned and etched to form a ribbon 410 of CNT material in place on the surface including the sidewall 405 of the metal layer 402 and the top 412 of the metal layer 402.

Figure 4E:
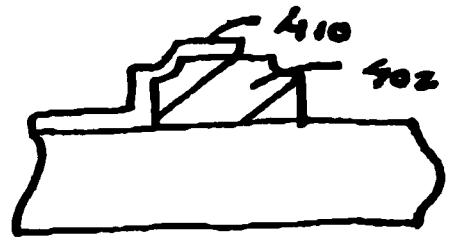

Referring to FIG. 4(e), the layer 410 of carbon nano-tubes is patterned and etched to form a ribbon 410 of CNT material in place on the surface including the sidewall of the metal layer 402 and the top 412 of the metal layer 402. The CNT ribbon 410 extends beyond the desired amount of overlap. In this example, the ribbon overlap is over the top of the metal layer and over a notched portion. Once the layer 410 of carbon nano-tubes has been etched into the appropriate pattern the photo mask is removed. Because the layer of carbon nano-tubes is delicate solvents are generally used to remove the photomask layer.

Figure 4F:
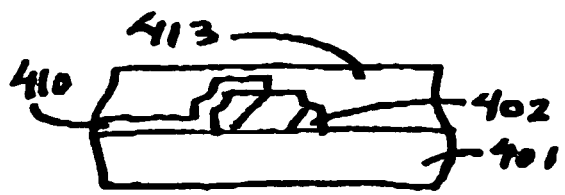

Referring to FIG. 4(f), the substrate 401 is then covered in an electrically insulative material. This insulating material 413 covered the CNT 410 and the metal layer 402 as well as portions of the substrate 401. One particularly useful embodiment uses silicon dioxide ($SiO_2$) as the insulating material 413. Of course, the inventors contemplate that any type of electrically insulating material can be employed to as the insulating material 413. Other commonly used insulative materials include but are not limited to porous $SiO_2$, FSG (fluorosilicate glasses), low-K dielectric materials, and the like.

Figure 4G:
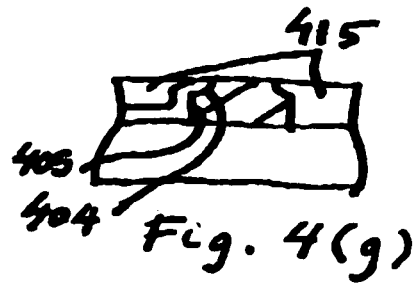

Once the CNT ribbon is insulated, the excess insulative material is removed to form an insulative layer and expose a portion of the metal layer if desired. Referring to FIG. 4(g), the excess insulating material is removed to form insulating layer 415. The CNT 410 remains in good electrical contact with the sidewalls of the metal layer 402 and also in good contact with the notched portions 404 at the top of the metal layer 402. Additionally, the insulating layer 415 provides good insulation for the buried CNT layer 410. The excess insulating material can be removed using techniques such as etching which is conducted until the metal layer is exposed. Alternatively CMP (chemical mechanical polishing techniques can be employed). The amount of overlap is then determined by the size of the notched portion and also the amount planarization of the top surface. For example, the planarization can continue until the entire notched portion 404 is removed. As a result, the final structure will have no overlap.

Figure 5A:
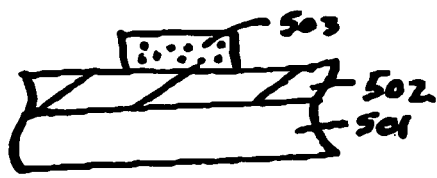
FIGS. 5(a)-5(g) depict another series of a simplified schematic section views of another process embodiment used to fabricate nanotube layers aligned with an etched feature in accordance with the teachings of the invention.

FIGS. 5(a)-5(g) depict yet another embodiment of constructing a nanotube apparatus. FIG. 5(a) is a simplified schematic section view of a substrate 501 having a metallization layer 502 formed thereon. The depicted substrate and metal is much the same as shown in FIGS. 3(a) and 4(a). The metallization layer 502 is masked 503 (e.g., using a photoresist arranged in a mask pattern).

Figure 5B:
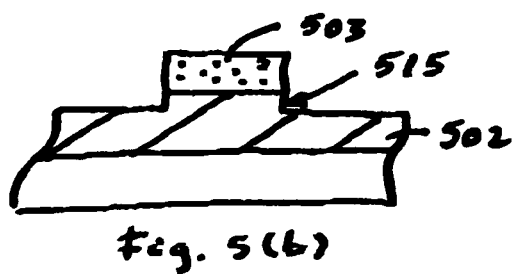

Referring to FIG. 5(b), the metal 502 is then subjected to a partial first anisotropic etch. Such anisotropic etch techniques are well known to those having ordinary skill in the art. This first isotropic etch operation etches the metal layer 502 a partial distance 515. The depth of this first etch should be one half the thickness of the metal layer or less.

Figure 5C:
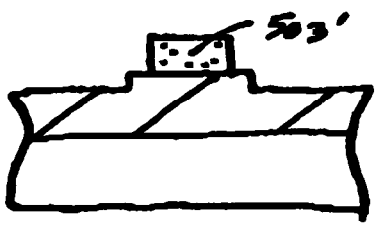

Referring to FIG. 5(c), the photo mask 503 is then etched (or otherwise narrowed) to reduce the line width of the photo mask. This new narrowed photo mask pattern 503' serves as the mask for further etching.

Figure 5D:
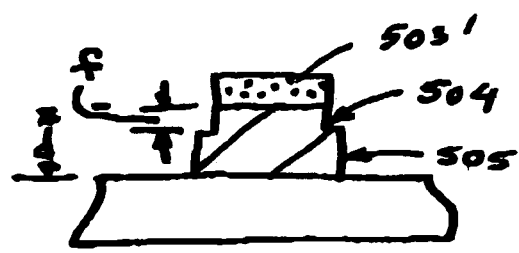

FIG. 5(d) shows a second etch step that comprises an anisotropic etch step. The remaining metal is anisotropically etched to form vertical sidewalls 505 and fully render a notched feature 504. Methods of anisotropic etching to obtain nearly vertical sidewalls are known to those having ordinary skill in the art. By way of example, reactive ion etching (RIE) or other directional etch techniques can be employed. The exact techniques will vary depending on the metal materials and substrate materials involved as well the final desired profile of the sidewalls. As explained previously, the two etch steps are conducted so that height f of the notched feature 504 is preferably less than about half the height d of the metal layer 502. At this point, the remaining photomask layer 503' is removed.

Figure 5E:
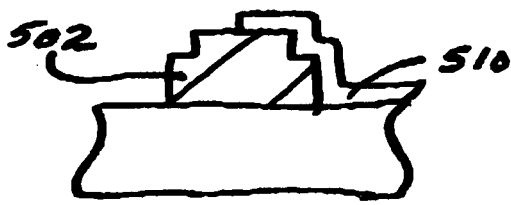

FIG. 5(e) depicts a layer of nanomaterials 510 that has been deposited on the substrate and then patterned and etched into the desired pattern. Significantly, the nanomaterials overlap into the notched region and onto the top of the metal layer an amount greater than the final desired amount of overlap. Commonly, the nano-material is comprised of carbon nano-tubes. However, many other nano-materials known in the art can also be employed in accordance with the principles of the invention. Methods of forming such layers of carbon nano-tubes are well known in the art and need not be discussed in detail here.

As before, the layer 510 of carbon nano-tubes can be deposited onto the substrate and patterned to form a ribbon 510 of CNT material in place on the surface including the sidewall of the metal layer 502 and the top of the metal layer 502. As in the previous embodiments, the CNT ribbon 510 extends beyond the desired amount of overlap. In this example, the ribbon overlap is over the top of the metal layer and over a notched portion. Once the layer 510 of carbon nano-tubes has been etched into the appropriate pattern the photo mask is removed. Because the layer of carbon nano-tubes is delicate solvents are generally used to remove the photomask layer.

Figure 5F:
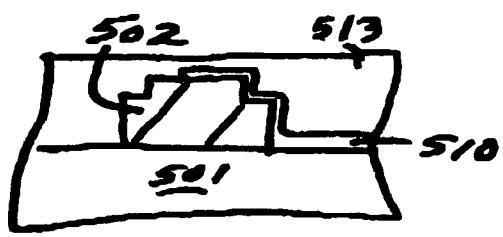

Referring to FIG. 5(f), the substrate 501 is then covered in an electrically insulative material. This insulating material 513 covered the CNT 510 and the metal layer 502 as well as portions of the substrate 501. One particularly useful embodiment uses silicon dioxide ($SiO_2$) as the insulating material 513. Of course, the inventors contemplate that any type of electrically insulating material can be employed to as the insulating material 513. Other commonly used insulative materials include but are not limited to porous $SiO_2$, FSG (fluorosilicate glasses), low-K dielectric materials, and the like.

Figure 5G:
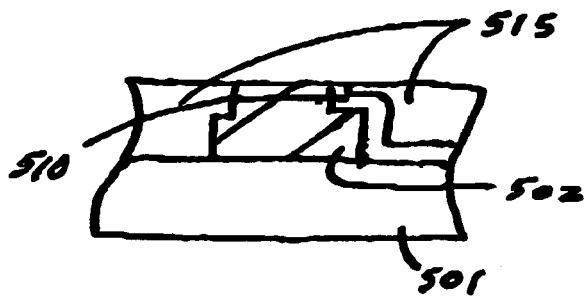

Once the CNT ribbon is insulated, the excess insulative material is removed to form an insulative layer and expose a portion of the metal layer if desired. Referring to FIG. 5(g), the excess insulating material is removed to form insulating layer 515. The CNT 510 remains in good electrical contact with the sidewalls of the metal layer 502 and also in good contact with the notched portions 504 at the top of the metal layer 502. Additionally, the insulating layer 515 provides good insulation for the buried CNT layer 510. The excess insulating material can be removed using techniques such as etching which is conducted until the metal layer is exposed. Alternatively CMP (chemical mechanical polishing techniques can be employed). The amount of overlap is then determined by the size of the notched portion and also the amount planarization of the top surface. For example, the planarization can continue until the entire notched portion 504 is removed. As a result, the final structure will have no overlap.

Some of the advantages realized by some embodiments of the invention include, but are not limited to, a wider tolerance for misalignment between the metal and nanotube layers. Especially, the methodologies described herein are capable of dealing with line width variation in the metal lines caused by imperfections in lithography processes. Also, the described processes are more resilient to alignment failures in the various fabrication processes.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Although only a few variations and configurations are expressly disclosed herein, it should be appreciated by anyone having ordinary skill in the art that, using the teachings disclosed herein, many different implementations can be employed and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

I claim:

1. A method of forming a nanotube electrical connection aligned to an etched feature comprising a metal layer, the method comprising:
   providing a substrate;
   forming an etched feature on the substrate, wherein the etched feature comprises a raised metal layer on the substrate, the metal layer having a top and a side;
   depositing and patterning the nanotube layer such that the nanotube layer contacts a portion of the side of the metal layer and overlaps a portion of the top of the metal layer;
   forming an insulating layer that covers the nanotube layer; and
   removing a top portion of the insulating layer to expose a top portion of the metal layer and removing the nanotube layer from on top of the metal layer leaving the nanotube layer in contact with the metal layer.

2. The method of claim 1 wherein forming the raised metal layer comprises forming the raised metal layer using an anisotropic process.

3. The method of claim 1 wherein forming the raised metal layer comprises forming the metal layer having side portion with a sloped profile; and
   wherein depositing and patterning a nanotube layer includes depositing a portion of the nanotube layer so that it contacts the sloped side portion and overlaps a portion of the top of the metal layer.

4. The method of claim 1 wherein removing a top portion of the insulating layer is accomplished using chemical mechanical polishing.

5. The method of claim 1 wherein removing a top portion of the insulating layer is accomplished using etching.

6. The method of claim 1 wherein the raised metal layer is formed by:
   photomasking the substrate to define a mask pattern on the metal layer;
   first isotropic etching the metal layer such that some of the etch undercuts the mask pattern and extends under edges of the mask pattern to remove a portion of the top surface of the metal layer forming a notched feature on the metal layer;
   second anisotropic etching to complete the formation of the raised metal layer; and
   removing the photomask pattern;
   and wherein depositing and patterning a nanotube layer includes forming a nanotube layer such that the nanotube layer contacts portions of the side of the metal layer, the notched portion of the metal layer, and overlaps a portion of the top of the metal layer; and wherein removing a top portion of the insulating layer exposes a top portion of the metal layer, removes the nanotube layer from on top of the metal layer, and leaves a portion of the nanotube layer overlapping a portion of the metal layer in the region defined by the notched feature, thereby insuring the nanotube layer remains in contact with the metal layer.

7. The method of claim 6 wherein the first isotropic etching is conducted so that the notched feature extends downward no more than half of the height of the metal layer.

8. The method of claim 1 wherein the raised metal layer is formed by:

photomasking the substrate to define a mask pattern on the metal layer;

first anisotropically etching the metal layer such that some of the etch undercuts the mask pattern and extends under edges of the mask pattern to remove a portion of the top surface of the metal layer;

narrowing the line width of portions of the photomask mask pattern to expose portions metal layer;

second anisotropically etching of the metal layer to define the raised metal layer having a notched feature on the top of the metal layer; and removing the photomask pattern;

and wherein depositing and patterning a nanotube layer includes forming a nanotube layer such that the nanotube layer contacts portions of the side of the metal layer, the notched portion of the metal layer, and overlaps a portion of the top of the metal layer; and wherein removing a top portion of the insulating layer exposes a top portion of the metal layer, removes the nanotube layer from on top of the metal layer, and leaves a portion of the nanotube layer overlapping a portion of the metal layer in the region defined by the notched feature, thereby insuring the nanotube layer remains in contact with the metal layer.

9. The method of claim 8 wherein the first anisotropic etching is conducted so that the notched feature extends downward no more than half of the height of the metal layer.

10. The method of claim 9 wherein the second anisotropic etching is conducted to etch the metal layer a remaining distance down to the substrate.

11. The method of claim 1 wherein forming the raised metal layer comprises depositing metal-containing materials on the substrate.

12. The method of claim 11 wherein depositing metal-containing materials comprises depositing a layer of material selected from among aluminum, tungsten, tantalum, and titanium.

13. The method of claim 11 wherein depositing metal-containing materials comprises depositing metal alloys.

14. The method of claim 11 wherein depositing metal-containing materials comprises depositing metal nitrides.

15. The method of claim 11 wherein depositing metal-containing materials comprises depositing more than one layer of metal-containing material.

16. A method of forming a nanotube connection aligned to an etched feature, the method comprising:

providing a substrate;

forming an etched feature on the substrate, the etched feature including a top surface and a side surface;

depositing and patterning a nanotube layer such that the nanotube layer forms a nanotube ribbon that contacts the side and top surfaces of the etched feature;

forming an insulating layer that covers the nanotube ribbon and the etched feature; and processing the substrate to remove a top portion of the insulating layer to expose the top portion of the etched feature while also removing the nanotube ribbon from the top of the etched feature while leaving an insulated nanotube ribbon in contact with the side surface of the etched feature.

* * * * *